United States Patent [19]

Hartmann et al.

[11] 4,121,170

[45] Oct. 17, 1978

[54] TUNABLE OSCILLATOR WITH HIGH STABILITY AND ACCURATE FREQUENCY

[75] Inventors: Heribert Hartmann, Hohenbrunn Riemerling; Guenter Wess, Seefeld, both of Germany

[73] Assignee: Siemens Aktiengesellschaft, Berlin & Munich, Germany

[21] Appl. No.: 818,088

[22] Filed: Jul. 22, 1977

[30] Foreign Application Priority Data

Sep. 15, 1976 [DE] Fed. Rep. of Germany ....... 2641501

[51] Int. Cl.² .............................................. H03B 3/04
[52] U.S. Cl. ...................................... 331/1 A; 331/17
[58] Field of Search ................... 331/17, 1 A; 307/295

[56] References Cited

U.S. PATENT DOCUMENTS

| | | | |
|---|---|---|---|
| 3,514,713 | 5/1970 | Leyde | 331/17 |
| 3,872,396 | 3/1975 | Bastide et al. | 331/17 |

FOREIGN PATENT DOCUMENTS

281,115   5/1970   Austria.
1,210,803   11/1970   United Kingdom.

*Primary Examiner*—John Kominski
*Attorney, Agent, or Firm*—Hill, Gross, Simpson, Van Santen, Steadman, Chiara & Simpson

[57] ABSTRACT

A tunable oscillator with high frequency stability and accuracy which utilizes a counter that periodically checks the actual value of the frequency and depending upon the count reached in the counter stage produces one of two logic output signals such that the first signal is formed on the occurrence of a number from a first correlated number sequence which indicates a frequency deviation from the desired value in a first direction and the second number is formed on the occurrence of a number which deviates from the desired frequency in a second direction and wherein logic signals are used to directly or indirectly recharge a capacitor at varying time constants depending upon the frequence drift.

11 Claims, 3 Drawing Figures

TUNABLE OSCILLATOR WITH HIGH STABILITY AND ACCURATE FREQUENCY

BACKGROUND OF THE INVENTION

1. Field of the Invention

This invention relates in general to stabilized oscillators.

2. Description of the Prior Art

Austrian Pat. No. 281,115 discloses an oscillator which is stabilized relative to its frequency drift due to the undesired characteristic fluctuations of the circuit elements and only slight frequency alterations in the time pulse train of the individual counting processes are required which represent points of instability in the frequency-time function. These alterations of the frequency value are particularly disturbing to the frequency characteristic of the oscillator when the regulating circuit is designed such that the regulating voltage alterations and thus the frequency alterations in the time unit exceed a specific degree.

SUMMARY OF THE INVENTION

The present invention comprises a tunable oscillator which has a high degree of frequency accuracy and stability which uses a counter that periodically checks the frequency's actual value and depending upon the counts reached by the counter stage in its lowest counting unit one of two logic signals is formed. The first signal is formed on the occurrence of a number which deviates from a first correlated number which indicates a frequency deviation from the theoretical value in a first direction and the second signal is formed on the occurrence of a number which deviates from the correlated number sequence in a second direction which indicates a frequency deviation from the theoretical value in the opposite direction. The logic signals thus formed are used directly or indirectly to recharge a capacitor whose charging voltage represents a regulating voltage which is supplied to the oscillator to vary frequency to reduce the frequency drift. The charging rate of the charging circuit can be varied.

Austrian Pat. No 281,115 discloses an oscillator of this type and these measures permit an oscillator to be stabilized relative to its frequency drift to the undesired characteristic value fluctuations of the circuit elements but this necessitates slight frequency alterations in the time pulse train of the individual counting processes and these represent points of instability in the frequency time function. These alterations of the frequency actual value are particularly disturbing to the frequency characteristic of the oscillator when the regulating circuit is designed such that the regulating voltage alterations and thus the frequency alterations in the time unit exceed a specific degree. However, if the regulating voltage alterations in the time unit are reduced which would in fact be desirable in order to achieve a uniform output frequency a rapid drift of the oscillator occurs for example when the device is switched on due to the rapid temperature rise which occurs or in the event of other rapid changes in the environmental temperature and this can lead to a departure from the regulating range and to the oscillator drifting freely.

The aim of the present invention is to eliminate these difficulties in oscillators of this type and it is achieved according to the invention in that the recharging circuit of the capacitor contains a switch which is actuated in the event of simultaneous occurrence of identical or different numerical values directly in series in one of the number sequences and causes the charging or discharging time constant to switch from a first value to a lower value. According to a further feature of the invention the recharging circuit of the capacitor contains a switch which is actuated on the occurrenc of those numerical values in those sequences which characterize a greater frequency deviation from the theoretical value than a predeterminable number of other numerical values in the same number sequences and which cause the charging or discharging time constant to switch over to a lower value.

The advantage which can be achieved with the invention is that in spite of the fact that the design of the regulating circuit is adapted to the normal drift characteristics of the oscillator and thus an optimum uniform output frequency is achieved when necessary it is also possible to reliably control much more rapid frequency drifts.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure and in which:

DESCRIPTION OF THE PREFERRED EMBODIMENTS

Figure 1:
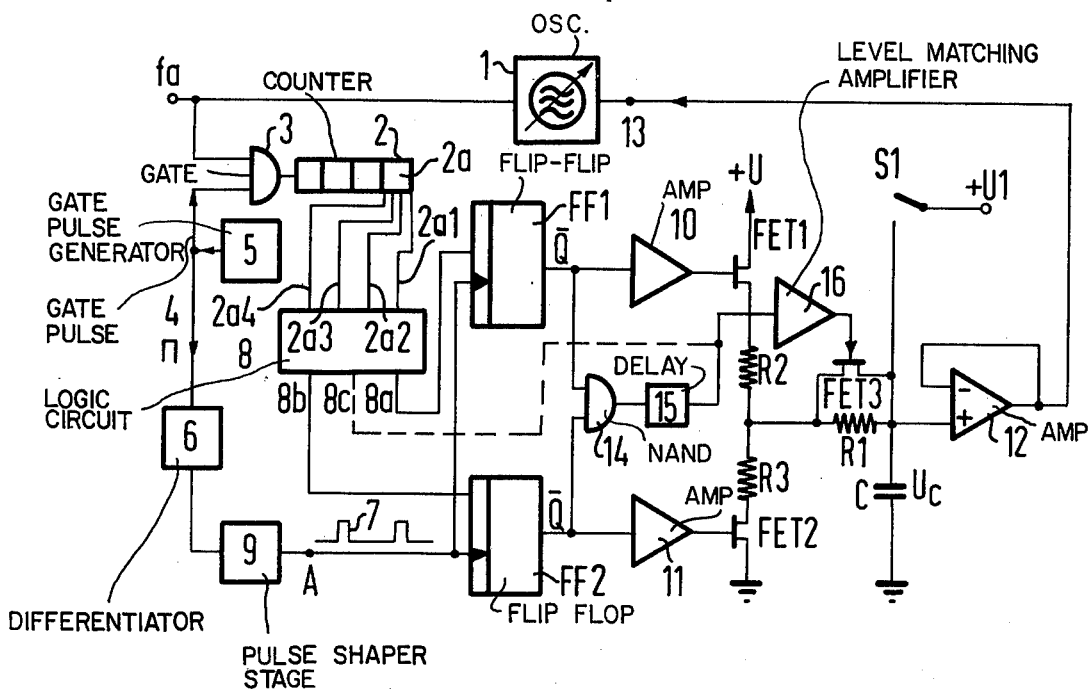
FIG. 1 illustrates a first embodiment in block diagram form.

FIG. 1 illustrates in block form the invention wherein an oscillator 1 produces an output $f_a$ as its output frequency. The oscillator 1 is adjustable by electrical signals applied to its frequency control input terminal 13. The output frequency $f_a$ is supplied to a gate 3 which also receives gate pulses from a gate pulse generator 5 and the oscillator signal $f_a$ is received by a counter 2 when the gate 3 is enabled. The gate pulses 4 from the gate pulse oscillator 5 are of rectangular form as illustrated and the individual count accumulated in the counter 2 during the gate pulse 4 determines the oscillation frequency of the oscillator 1. The gate pulses 4 also are supplied to a differentiating circuit 6 which supplies an output to a pulse shaper stage 9 and trigger pulses 7 are formed from the rear edges of the gate pulses 4 in the differentiator circuit 6 and the pulse shaper circuit 9.

The outputs of the counter stage $2a$ of the lowest value are referenced $2a1$-$2a4$. These emit logic signals in binary coded form which characterize the relevant count of the stage $2a$. A logic circuit 8 receives the inputs $2a1$ through $2a4$ and analyzes these logic signals such that on the occurrence of the counts 9, 8, 7 or 6 a first output $8a$ displays a logic "1" whereas on the occurrence of the count 1, 2, 3, 4, or 5 a second output $8b$ displays a logic "1". In either case the output which does not display logic "1" displays a logic "0" signal. The signals which occur at outputs $8a$ control a JK flip flop circuit FF1 and the signals emitted at output $8b$ controls a second JK flip flop circuit FF2.

The timing pulses 7 are fed to the trigger inputs of flip flop circuits FF1 and FF2 from the pulse shaper stage 9 whenever the final counts of counter 2 are reached at the end of each counting process. In this manner on the occurrence of one of the numerical values 1 through 5 the FF1 flip flop displays a "1" at its output $\overline{Q}$ and the flip flop FF2 has a "0" at its output $\overline{Q}$. On the other hand on the occurrence of the numerical values of 9, 8, 7 or 6 the flip flop FF1 is switched to the "0" stage at its output $\overline{Q}$ and the flip flop FF2 is switched to produce "1" at its output $\overline{Q}$. On the occurrence of the numerical value 0 both flip flops FF1 and FF2 are set to 1 at their $\overline{Q}$ outputs. The "0" signal emitted from flip flop FF1 turns on a first field effect transistor FET1 and renders it into the conductive stage through amplifier 10 which serves to match the level. When the FET1 is turned on a recharging circuit for capacitor C is closed and which passes the voltage $+U$ through resistor R2 and resistor R1 to capacitor C. A second recharging circuit is formed for the capacitor C when the flip flop circuit FF2 switches over at its output $\overline{Q}$ from "1" to "0" as this latter signal turns on a second field effect transistor FET2 into the conductive stage by way of a level matching amplifier 11 and connects a further resistor R3 to ground between the junction point of resistors R1 and R2. The capacitor C which is connected by its lower terminal to ground and which prior to the start of the frequency regulation is connected through a closed switch S1 to a voltage $+U1$ which has a smaller value than $+U$ is disconnected from the voltage $+U1$ at the beginning of the regulating process by opening of the switch S1 and when the field effect transistor FET1 is turned on the capacitor C is charged to a higher voltage value which is dependent upon the interval of time between the timing pulses 7. On the other hand when the field effect transistor FET2 is turned on the capacitor is discharged to a lower voltage value. Thus in the case of an alteration of numerical values from the first and second number sequences or the lower and higher number sequences, the charging voltage $U_c$ of the capacitor follows a time function which extends in the rising and falling directions between two fixed limit values according to the particular spacing of the time pulses 7 and thus is in the form of a triangular voltage. The voltage across the capacitor $U_c$ then represents a regulating voltage which is used to stabilize the oscillator 1 in its frequency and which is fed through an amplifier 12 connected as an impedance transformer to the frequency control input 13 of the oscillator 1.

Thus, the theoretical value of the output frequency $f_a$ at which the oscillator 1 is maintained taking into account a specific tolerance range is represented by the numerical value "0" of the counter stage 2a in the exemplary embodiment shown in FIG. 1. It will thus be clear however that due to the indetermination of the other digits of the counter results this is a sequence of theoretical values whose frequency spacings relative to one another correspond to one counting element of the next to last counter stage of the counter. The selection from the individual theoretical values which can also be referred to as lock positions is made by an appropriate setting of the tuning means of the oscillator 1. The logic circuit 8 can also be designed such that the oscillator 1 is regulated not to "0" but to any other numerical value of the counter stage 2a.

In addition to the previously described triangular form of the regulating voltage $U_c$ between two fixed limit values which is attained only in the case of a strictly alternating occurrence of the numerical values obtained in the counter stage 2a from the two number sequences, in the event of temporary frequency deviations which within a timing pulse interval are greater than the regulation range which relates to the same time interval a plurality of alterations $U_c$ in the same direction can occur one after another. If however the frequency deviations increase further it is no longer possible to maintain the stabilization of the oscillator with the previously described circuit. The time at which this state is reached will be the earlier the smaller the alteration quantity of the voltage $U_c$ is and thus the regulation range of the circuit within one timing pulse interval.

So as to enable these frequency alterations of the oscillator 1 to also be controlled a switch comprising the field effect transistor FET3 is connected in parallel with resistor R1 which selectively shunts the resistor R1 when it is conducting and thus changes the time constant of the charging or discharging circuit for capacitor C. The switch FET3 is controlled depending upon the logic signals which occur at the output $\overline{Q}$ of the flip flop circuits FF1 and FF2. These signals are fed through the NAND gate 14 and through a delay circuit 15 which supplies its output to an amplifier 16 which serves to match the level. This circuit operates such that on the simultaneous occurrence of "1" states at the $\overline{Q}$ outputs of circuits FF1 and FF2 which indicates the theoretical state of the oscillator frequency, the delay circuit 15 is switched into its starting condition. The output of delay circuit 15 then displays a "1" and through the level matching circuit 16 the field effect transistor FET3 is switched into the nonconductive state. If one of the $\overline{Q}$ outputs of the flip flops FF1 and FF2 is switched to the "0" state the delay circuit 15 starts to operate and after a specific predeterminable time switches the field effect transistor FET3 into the conductive state. If a "1" signal is emitted again from the two $\overline{Q}$ outputs of the flip flop circuits FF1 and FF2 before the expiration of the time delay the delay circuit is reset to the starting state without the transistor FET3 being switched into the conductive state.

According to a further development of the principle of the invention the switch FET3 can also be actuated by means of a logic "1" signals which are taken from a further output 8c of the logic circuit 8 and are fed to the level matching amplifier 16. In this case the logic circuit 8 is designed such that the "1" signals occur at 8c whenever the numerical values 2, 3, 4, 5, 8, 7 and 6 are obtained in counter 2a. In other words when the frequency deviation of $f_a$ from the theoretical values $f_{ao}$ amounts to more than two counting elements of the counter stage 2a in any direction the switch FET3 is switched into the conducting stage by the signals at output 8c. With this circuit version the NAND gate 14 on the delay circuit 15 are not required.

Figure 2:
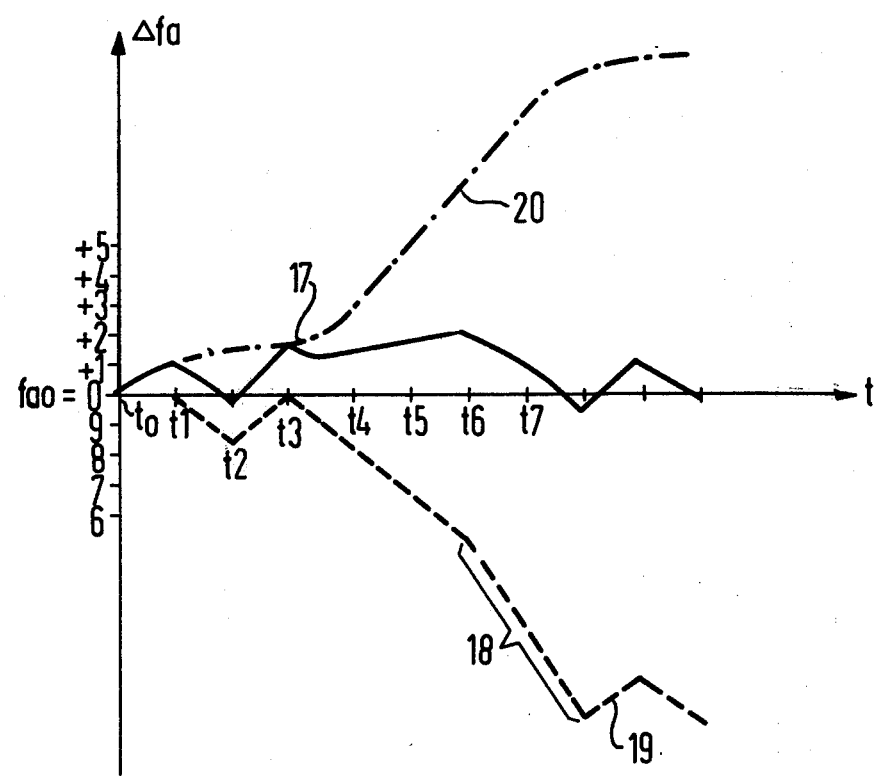
FIG. 2 is a plot of frequency vs. time to explain FIG. 1.

FIG. 2 can be considered to explain the regulating processes. In a frequency-time diagram the frequency deviations $\Delta f_a$ from the theoretical frequencies $f_{ao}$ are plotted in numerical values of the last counter stage 2a over the time axis $t$. At the time $t1$ to $t6$ and so forth timing pulses 7 occur which switch over the starting states of the flip flops depending upon the results of the counter. The frequency curve which is initially produced due to the drift of the oscillator 1 is indicated in dash-dot line. Assuming that this curve passes through the theoretical value $f_{ao}$ at the time $t_o$ and rises slowly approximately to a curve point 17, the time $t1$ is the first occasion on which a frequency deviation of $+1$ is established. From this time onward as a result of the action of the frequency regulating circuit an additional frequency alteration corresponding to the broken line curve is produced. The output frequency $f_a$ then follows the sum curve which is shown in solid line. The sum curve consequently corresponds with the dash-dot curve from $t0$ to $t1$ and then deviates in the direction of the time axis under the influence of that branch of the broken line curve which runs from $t1$ to $t2$ and whose gradient is determined by the time constant in the recharging circuit of the capacitor C. At time $t2$, $f_a$ is just below the value of $f_{ao}$ which leads to a rising branch of the broken line curve between $t2$ and $t3$. A frequency displacement of $+1$ at the time $t3$ then again produces a rising arm of the broken line curve between $t3$ and $t4$. As positive frequency displacements are established at times $t4$, $t5$ and $t6$ and consequently a "0" signal which lasts for three timing pulse intervals occurs at the output $\overline{Q}$ of flip flops FF2 and FET3 is switched by way of the circuit components 14 through 16 so that the time constant of the recharging circuit C is reduced as a result of the shunting of the resistor R1 as a result a steeper drop occurs in the broken line curve at 18 and causes the solid line curve to reapproach the theoretical value of $f_{ao}$. Not until the actual output frequency of $f_a$ again undershoots $f_{ao}$ is the time constant of the recharging circuit of the capacitor C increased again as a result of turn off of the field effect transistor FET3 so that the adjoining rising arm 19 of the broken line curve exhibits the same upward gradient as the branch located between $t2$ and $t3$. However this compensates the rapid drift of the oscillator 1 which is expressed by part 20 of the dash-dot curve.

According to the description further development of the principle of the invention at the time $t6$ the logic circuit 8 would establish a frequency deviation of $+2$ which would be used to emit through the output $8c$ a "1" signal which switches the switch FET3 to the conducting stage. When the solid line curve drops to the deviation value of $+1$ at the time $t7$ the time constant would be increased again so that in this case at the time $t7$ a continuous rising and falling of the output frequency $f_a$ would occur between the deviation values of $+1$ and $+2$.

Figure 3:
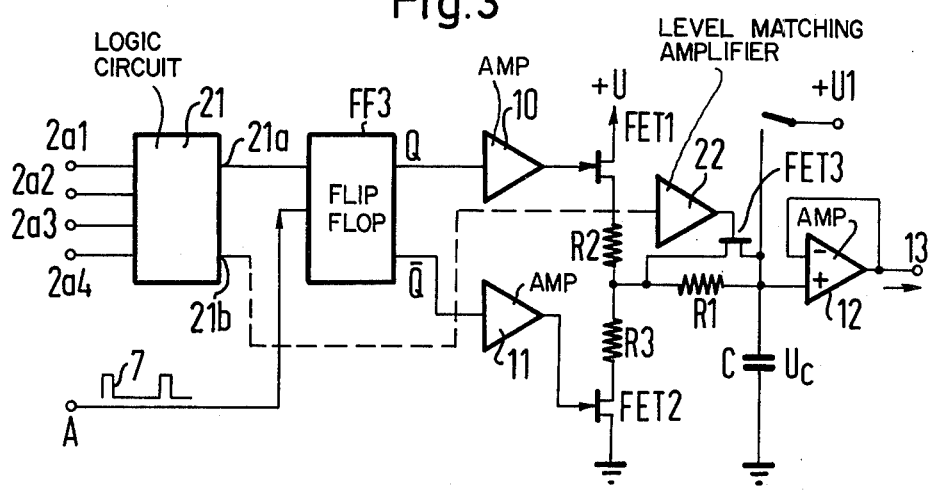
FIG. 3 illustrates a second embodiment of the invention.

FIG. 3 illustrates another embodiment of the invention in which the outputs $2a1$ to $2a4$ of the counter stage $2a$ are connected to the inputs of a logic circuit 21. On the occurrence of numerical values 1, 2, 3, 4 and 5 from $2a$ a "1" signal is emitted from a first output $21a$ and on the occurrence of the numerical values 0, 9, 8, 7 and 6 a "0" signal is emitted. The "1" signal sets a subsequently connected JK flip flop FF3 which then on the occurrence of the next timing pulse 7 fed from a point A to the counting input switches over the output $\overline{Q}$ to "0". The "0" signal passes through a level matching amplifier 11 and causes the switch FET2 to move into the conductive state. If the "0" signal is present at $21a$ the flip flop FF3 is not set and the signal "1" is retained at the output $\overline{Q}$. In this case the field effect transistor FET2 is nonconducting. The switch FET1 which is in fact controlled with the complementary output Q of flip flop FF3 in each case assumes the opposite switching state of the field effect transistor FET2. The charging and discharging processes of the capacitor C which are controlled with the field effect transistors FET1 and FET2 occur as described with reference to the circuit of FIG. 1. So as to enable rapid drift processes to be controlled the logic circuit 21 is designed in such a manner that when the numerical values 2, 3, 4, 5, 9, 8, 7 and 6 occur in the counter stage $2a$ then by way of output $21b$ the logic circuit 21 emits a "1" signal which switches the switch FET3 into the conducting state by way of a level matching amplifier 22 and in this manner again reduces the time constant for the recharging processes of the capacitor C.

It is seen that this invention has been described with respect to preferred embodiments and although it has been described with such respect to such embodiments is not to be so limited as changes modifications may be made therein which are within the full intended scope as defined by the appended claims.

I claim as my invention:

1. A tunable oscillator having a high degree of frequency accuracy and stability, wherein a counter is provided which periodically checks the actual frequency output of the oscillator and wherein, depending upon the counting value reached in the lowest stage of the counter produces one of two logic signals and the first signal is formed on the occurrence of a number which deviates in a first, correlated number sequence which indicates a frequency deviation from the theoretical value in a first direction, and the second signal is formed on the occurrence of a number which deviates in a second correlated number sequence which indicates a frequence deviation from the theoretical value in the opposite direction, and wherein said logic signals are used to recharge a capacitor, whose charging voltage represents a regulating voltage which reduces the frequency drift of said oscillator, characterized in that a recharging circuit for said capacitor (C) contains a switch (FET3), which is actuated on the repeated occurrence of indentical or differing numerical values directly in series in one of the number sequences, and causes the charging- or discharging- constant to switch to a lower value.

2. An oscillator as claimed in claim 1, characterized in that the switch (FET3) in the recharging circuit of the capacitor (C) is controlled by means of logic signals which are obtained through a delay circuit (15) and a logic linking element (14) depending upon the output signals from two bistable flip flop circuits (FF1, FF2), of which the first bistable circuit (FF1) is set with a logic circuit (8) which is connected to the outputs ($2a1$ to $2a4$) of the counter stage ($2a$) of the lowest value, as soon as a number in the first number sequence occurs, and whereas the second bistable circuit (FF2) is set with the logic circuit (8) as soon as a number in the second number sequence occurs.

3. A tunable oscillator exhibiting a high degree of frequency accuracy and constancy, wherein a counter is provided which periodically checks the frequency of the oscillator, wherein, depending upon the counts reached in the counter stage of the lowest value, one of two logic signals is formed, and the first signal is formed on the occurrence of a number which deviates in a first, correlated number sequence which indicates a frequency deviation from the theoretical value in a first direction, and the second signal is formed on the occurrence of a number which deviates in a second, correlated number sequence which indicates a frequency deviation from the theoretical value in the opposite direction, and wherein the logic signals are used to recharge a capacitor whose charging voltage represents a regulating voltage which reduces the frequency drift in the oscillator, characterized in that the recharging circuit of the capacitor (C) contains a switch (FET3) which is actuated on the occurrence of numerical values from these sequences, which indicate a greater frequency deviation from the theoretical value than a predeterminable number of other numerical values in the same number sequences, so as to cause the charging- or discharging-time constant of the capacitor to be switched to a lower value.

4. An oscillator as claimed in claim 3, characterized in that the switch (FET3) is the recharging circuit of the capacitor (C) is controlled with the output of a logic circuit (8) which is connected to the outputs (2a1 to 2a4) of the counter stage (2a) of the lowest value, and which emits a logic signal on the occurrence of numerical values, which indicate the greater frequency deviations from the theoretical value in both number and sequences.

5. An oscillator as claimed in claim 4, characterized in that the switch (FET3) in the recharging circuit of the capacitor (C) is arranged in parallel with a resistor (R1) and shunts it when the switch (FET3) is closed.

6. A tunable stable oscillator having a frequency control input terminal and an output terminal, a counter periodically receiving outputs for a fixed time of said oscillator and counting the frequency, a logic circuit connected to the lowest order stage of said counter, first and second bistable circuits connected to said logic circuit, reset means connected to said first and second bistable circuits to periodically reset them, first and second switch means connected, respectively, to the outputs of said first and second bistable circuits, first and second resistors connected in series between said first and second switch means, a capacitor connected to said frequency control terminal of said oscillator, a third resistor connected between said capacitor and the junction between said first and second resistors, a third switch means connected in parallel with said third resistor, and switch enable means connected between said logic circuit and said third switch to close said third switch means when the frequency of said oscillator deviates from the desired frequency more than preset limits.

7. A tunable oscillator according to claim 6, wherein said switch enable means is connected to the output of said first and second bistable circuits and includes a NAND gate.

8. A tunable oscillator according to claim 7 including a delay device connected between said NAND gate and said third switch means.

9. A tunable oscillator according to claim 7 wherein said switch enable means includes the logic circuit connected to the output of said counter which produces at least two outputs.

10. A tunable oscillator according to claim 9 wherein said logic circuit supplies inputs to said first and second bistable circuits.

11. A tunable stable oscillator having a frequency control input terminal and an output terminal, a counter periodically receiving outputs for a fixed time of said oscillator and counting the frequency, a logic circuit connected to the lowest order stage of said counter, a bistable circuit connected to said logic circuit, reset means connected to said bistable circuit to periodically reset it, first and second switch means connected, respectively, to the outputs of said bistable circuit, first and second resistors connected in series between said first and second switch means, a capacitor connected to said frequency control terminal of said oscillator, a third resistor connected between said capacitor and the junction between said first and second resistors, a third switch means connected in parallel with said third resistor, and switch enable means connected between said logic circuit and said third switch to close it when the frequency of said oscillator deviates from the desired frequency more than preset limits.

* * * * *